United States Patent [19]

Stienstra

[11] 4,249,038

[45] Feb. 3, 1981

[54] STEREO DECODER WITH 19KHZ-PILOT SUPPRESSION AND IMPROVED OSCILLATOR PHASE LOCKING

[75] Inventor: Albert J. Stienstra, Eindhoven, Netherlands

[73] Assignee: U.S. Philips Corporation, New York, N.Y.

[21] Appl. No.: 36,470

[22] Filed: May 7, 1979

[30] Foreign Application Priority Data

May 17, 1978 [NL] Netherlands ................. 7805292

[51] Int. Cl.³ .............................................. H04H 5/00
[52] U.S. Cl. ................................. 179/1 GD; 329/50; 329/122
[58] Field of Search .................... 179/1 GD, 1 GE; 329/122, 50, 167; 325/36

[56] References Cited

U.S. PATENT DOCUMENTS

| | | | |
|---|---|---|---|
| 3,133,993 | 5/1964 | De Vries | 179/1 GD |
| 4,160,217 | 7/1979 | Ohsawa | 329/122 |
| 4,164,624 | 8/1979 | Ogita | 179/1 GD |

*Primary Examiner*—Douglas W. Olms
*Attorney, Agent, or Firm*—Thomas A. Briody; William J. Streeter; Edward W. Goodman

[57] ABSTRACT

Stereo decoder for multiplex signals comprising a demultiplexer for decoding the left-hand and the right-hand sound signal of a stereo multiplex signal, a phase-locked loop which includes a phase-locked oscillator and a multiplicative phase detector, and a pilot elimination circuit, for reducing the pilot signal of a multiplex signal, which is used in two manners, namely, to suppress the pilot signal in the decoded left-hand and right-hand sound signal at the sound output of the demultiplexer, and to suppress disturbances in the frequency control of the phase-locked oscillator caused by sound components of the multiplex signal. To this end the phase detector comprises a differential reference input stage to which on the one hand the complete stereo multiplex signal is applied and on the other hand, in phase (common mode) therewith, the output signal of the pilot elimination circuit, that is to say the stereo multiplex signal with the suppressed pilot signal.

2 Claims, 2 Drawing Figures

STEREO DECODER WITH 19KHZ-PILOT SUPPRESSION AND IMPROVED OSCILLATOR PHASE LOCKING

BACKGROUND OF THE INVENTION

The invention relates to a stereo decoder for a multiplex signal comprising a demultiplexer having a signal input and a carrier input, the signal input being coupled to an input of the stereo decoder via a pilot-elimination circuit for reducing a pilot signal of a multiplex signal, the decoder also comprising a phase-locked loop having a phase-locked oscillator and a phase detector, said phase-locked oscillator being connected to the carrier input of the demultiplexer and the phase detector being provided with a reference input stage.

Such a stereo decoder is used in the tuner-amplifier unit ST 8080 of Matsushita Electric Trading Co. Ltd. Japan and published in print in the manual thereof.

Some sound recording devices, such as, for example, tape recording devices utilize automatic volume control, wherein the volume of the sound signal to be recorded is measured and brought to a certain level before actual recording occurs. If such sound recording devices are used for recording the sound signal at the outputs of a stereo decoder, the pilot signal (normally 19 KHz) might be included in the measurement of the amplitude of the sound signal, thus preventing a correct volume control and an optimal recording. To avoid this, the amplitude of the pilot signal of the multiplex signal which is applied to the demultiplexer is reduced by means of the pilot elimination circuit.

The carrier required for decoding the multiplex signal is produced in the phase-locked oscillator. The phase thereof is compared with the phase of the pilot signal of the multiplex signal by multiplying, in the phase detector, the oscillator signal by the multiplex signal applied to the phase detector via the input of the stereo decoder. The output signal of the phase detector being the control signal of the phase-locked oscillator therefore comprises, in addition to a desired component which indicates the phase relation between the oscillator signal and the pilot signal, unwanted components which originate, for example, from the sound components of the multiplex signal. These unwanted components may influence the frequency of the phase-locked oscillator so that a proper phase locking of the carrier to the pilot signal is disturbed. An optimal decoding of the stereo signal from the multiplex signal is then impossible.

SUMMARY OF THE INVENTION

It is an object of the invention to provide a stereo decoder, the output signal of which is not disturbed by the pilot signal and wherein the disturbing effect of the sound components of the multiplex signal on the phase locking of the voltage-controlled oscillator is reduced at the same time.

In accordance with the invention, a stereo decoder of the type defined in the preamble is therefore characterized in that the reference input stage comprises a differential amplifier, a first reference input of which is connected to the input of the stereo decoder and a second reference input is connected to an output of the pilot elimination circuit.

When using the measure in accordance with the invention, the output signal of the pilot elimination circuit, that is to say the multiplex signal with the suppressed pilot signal, is utilized in two manners. On the one hand the stereo signal is decoded therefrom in the demultiplexer, as in the prior art stereo decoder. On the other hand this multiplex signal with the suppressed pilot signal is applied in the same phase (common mode) to the differential amplifier of the reference input stage of the phase detector as the multiplex signal with the non-suppressed pilot signal which reaches the differential amplifier via the input of the stereo decoder. The components, applied in common mode, of the two multiplex signals, such as the sound components, fully cancel one another in the differential amplifier of the reference input stage. Only the non-suppressed pilot signal in the multiplex signal which is applied via the input of the stereo decoder appears uncompensated in the output signal of the differential amplifier. So this output signal contains no disturbing components originating from the sound components of the multiplex signal and is therefore particularly suitable for use as the phase reference signal for the carrier generated in the phase-locked oscillator.

Suppressing the pilot signal in the pilot elimination circuit of the known stereo decoder is achieved by applying a compensation signal, obtained from the oscillator signal by means of complicated circuits, to this pilot signal. For an effective suppression the compensation signal must be brought to the same shape and amplitude as the pilot signal to be compensated and must be applied with a 180° phase shift.

In a preferred embodiment of the stereo decoder according to the invention the pilot signal is suppressed in a simpler manner. Such a stereo decoder is therefore characterized in that the pilot elimination circuit comprises a band rejection filter having a resonance frequency of 19 KHz and a signal suppression of at least 20 decibel at the resonant frequency and which is not noticably operative for frequencies below 15 KHz and above 23 KHz.

DESCRIPTION OF THE DRAWING

The invention will now be further described by way of non-limitative example with reference to the Figures shown in the drawing.

Herein.

DESCRIPTION OF THE PREFERRED EMBODIMENT

Figure 1:
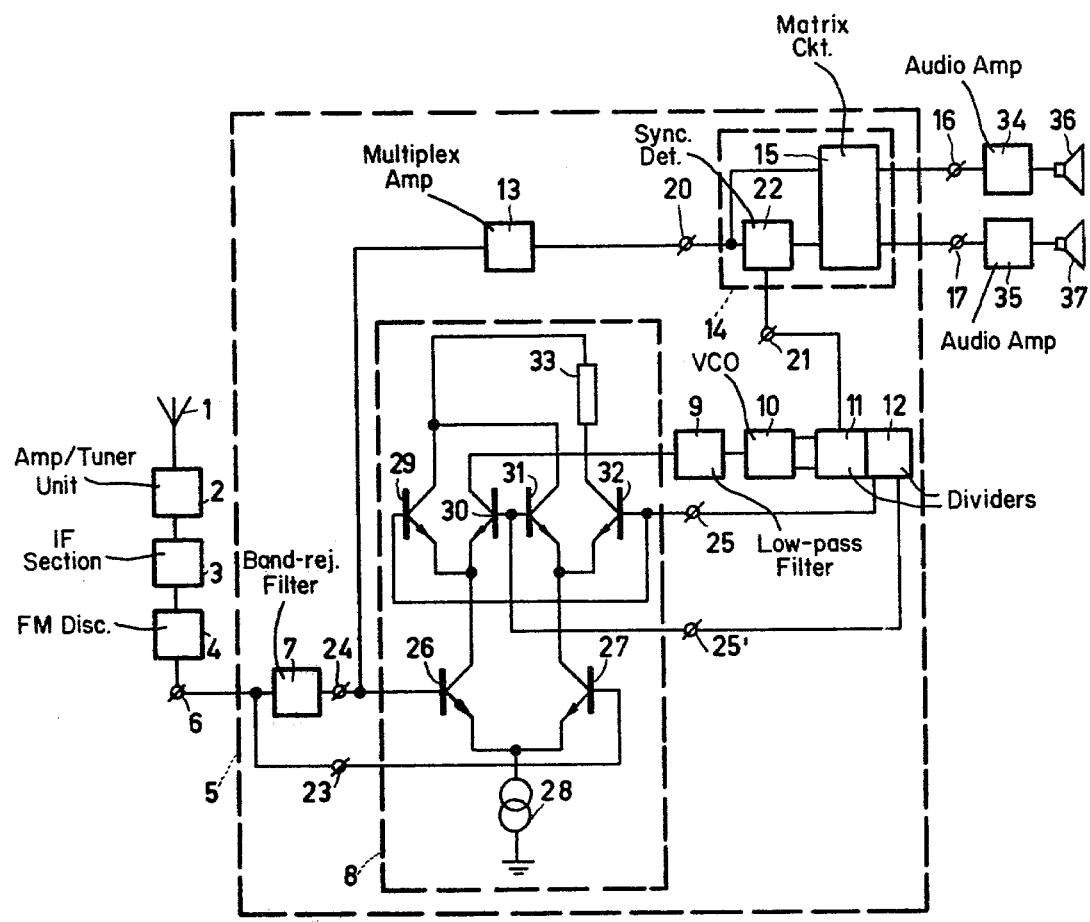
FIG. 1 shows a FM-stereo multiplex receiver having a stereo decoder according to the invention.

FIG. 1 shows a FM-stereo multiplex receiver having an aerial 1, and which has connected thereto, in succession: an input amplifier/tuner unit 2 for amplifying and transposing to the IF-range a desired FM aerial signal, an IF-section 3 for selectively amplifying and limiting the desired IF-FM signal, a FM discriminator 4 for converting the IF-FM signal into a stereo multiplex signal, and a stereo decoder 5 for decoding the left-hand and the right-hand sound signal L and R from the stereo multiplex signal. The sound signals L and R are applied to sound outputs 16 and 17 and , after amplification in the respective audio amplifiers 34 and 35, are reproduced by means of the loudspeakers 36 and 37, respectively.

The input amplifier/tuner unit 2, the IF-section 3 and the FM-discriminator 4 may be of a conventional construction. They are of no importance for understanding the invention and are therefore not described in further detail.

The FM-discriminator 4 applies a stereo multiplex signal to an input 6 of the stereo decoder 5. The stereo decoder 5 comprises a band rejection filter 7, which functions as pilot elimination circuit, connected to the input 6 for suppressing the pilot signal of the stereo multiplex signal. An output of the band rejection filter 7 is connected to a signal input 20 of a demultiplexer 14 through a multiplex amplifier 13 in which amplification of the stereo multiplex signal is effected. The demultiplexer 14 includes a synchronous detector 22 and a matrix circuit 15 wherein, in known manner, the difference signal (L-R) of the stereo signal is demodulated by means of a carrier (38 KHz) applied to a carrier input 21, whereafter the difference signal is combined with the sum signal (L+R) of the stereo signal, which results in separate left-hand and right-hand sound signals L and R at the sound output 16 and 17. The 19 KHz pilot signal is missing from these sound signals.

The stereo decoder 5 comprises a phase-locked oscillator 10 for the generation of the above-mentioned carrier (38 KHz). The oscillation frequency thereof is 76 KHz and is halved in a divide-by-two divider 11, which is connected to an output of the oscillator 10. The output signal of the divide-by-two divider 11 (38 KHz) is thereafter applied as a carrier to the carrier input 21 of the demultiplexer 14.

Locking of the phase of the oscillator 10 is effected by means of a feedback of the oscillator signal via, in this order, the divide-by-two divider 11 and a subsequent divide-by-two divider 12, in which the frequency is again halved, a multiplicative, double-balanced phase detector 8, wherein the phase difference is determined between the 19 KHz oscillator signal and the 19 KHz pilot signal of the stereo multiplex signal, and a low-pass filter 9 wherein a control signal is obtained from the output signal of the phase detector 8 for controlling the frequency of the oscillator 10.

The double-balanced phase detector 8 comprises a multiplication circuit 26 to 33 inclusive, which includes differential amplifier 26 to 28, inclusive, which functions as a reference input stage. A first input 23 of the differential amplifier 26 to 28, inclusive is coupled, as a first reference input, to the input 6 of the stereo decoder 5 and a second input 24 is coupled as a second reference input, to the output of the band rejection filter 7. The complete stereo multiplex signal is applied to the first input 23 of the differential amplifier 26 to 28, inclusive, whereas in phase (common mode) therewith, the stereo multiplex signal, with the suppressed 19 KHz pilot signal, is applied to the second input 24. The in-phase (common mode) applied components of the stereo multiplex signal cancel one another in the differential amplifier 26 to 28, inclusive, whereas only the 19 KHz pilot signal appears, uncompensated at the output of the differential amplifier 26 to 28, inclusive, i.e. at the collectors of the transistors 26 and 27 which function as a differential amplifier. In a multiplying stage 29 to 33, inclusive, of the phase detector 8, this 19 KHz pilot signal is multiplied in known manner by the 19 KHz oscillation signal which is fed from the output of the divide-by-two divider 12 via terminals 25 and 25'. So the output signal of the phase detector 8, applied to the low-pass filter 9, does not contain product components originating from the sound components of the stereo multiplex signal. Consequently the phase lock of the oscillator 10 is protected from disturbance caused by these sound components.

Figure 2:
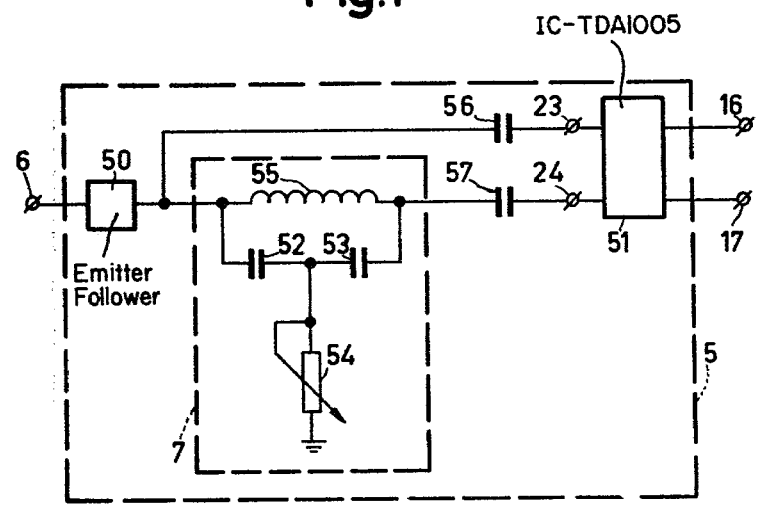
FIG. 2 shows a practical implementation of the stereo decoder according to the invention.

FIG. 2 shows a practical implementation of the stereo decoder 5 wherein the circuits, whose function corresponds to the function of the circuits of FIG. 1, have been given the same reference numerals.

The stereo decoder 5 comprises, coupled to the input 6, an emitter follower 50 for amplifying the multiplex signal. An output of the emitter follower 50 is connected, through a coupling capacitor 56, to the first input 23 of the phase detector 8 which is included in an integrated circuit 51, and to the band rejection filter 7. By way of a coupling capacitor 57 an output of the band rejection filter 7 is connected to the second input 24 of the phase detector 8 which, as mentioned previously, is included in the integrated circuit 51.

In this practical implementation the integrated circuit 51 is of the type TDA 1005 and comprises, in addition to the phase dectector 8, the circuits 9 to 14 inclusive and the sound outputs 16 and 17 of the preceding Figure. On the integrated circuit 51, the first input 23 is denoted by terminal number 12, the second input 24 by terminal number 11.

The band rejection filter 7 has an active signal suppression in a frequency range between 15 KHz and 23 KHz with a maximum signal suppression at its 19 KHz resonant frequency which exceeds 20 dB. For frequencies below 15 KHz and above 23 KHz the signal suppression is not noticeable and is less than 1 dB. To that end the band rejection filter 7 is implemented as a bridged T-filter having a series arrangement of two identical capacitors 52 and 53 in the parallel branch, a variable resistor 54, connected to ground, in the series branch and an inductance 55 in the bridging branch. Each of the capacitors 52 and 53 has a capacitance of 56 nF. The inductance is 26 mH and the variable resistor is adjustable between 1 kΩ and 1.46 kΩ.

What is claimed is:

1. A stereo decoder for a multiplex stereo signal, said stereo decoder comprising an input, a pilot elimination circuit coupled to said input, a demultiplexer having a signal input and a carrier input, said demultiplexer signal input being coupled to said pilot elimination circuit, and a phase-locked loop having a phase-locked oscillator, an output of which is coupled to said demultiplexer carrier input, and a phase detector, wherein said phase detector has a reference input stage which comprises a differential amplifier, a first reference input of which being coupled to the said input of the stereo decoder and a second reference input of which being coupled to an output of the pilot elimination circuit.

2. A stereo decoder as claimed in claim 1, wherein the pilot elimination circuit comprises a band rejection filter which has a resonant frequency of 19 KHz and a signal suppression of at least 20 decibel at the resonant frequency, and which is not noticeably active for frequencies below 15 KHz and above 23 KHz.

* * * * *